United States Patent [19]

Kimura et al.

[11] Patent Number: 5,521,523
[45] Date of Patent: May 28, 1996

[54] PROBE CARD ASSEMBLY AND METHOD OF MANUFACTURING PROBE CARD ASSEMBLY

[75] Inventors: Hidetoshi Kimura, Nirasaki; Tetsuya Utsunomiya, Kofu; Chiaki Mochizuki, Yamanashi, all of Japan

[73] Assignees: Tokyo Electron Limited, Tokyo; Tokyo Electron Yamanashi Limited, Nirasaki, both of Japan

[21] Appl. No.: 165,940

[22] Filed: Dec. 14, 1993

[30] Foreign Application Priority Data

Dec. 14, 1992 [JP] Japan ................................ 4-354070

[51] Int. Cl.⁶ .................................................. G01R 31/02
[52] U.S. Cl. .................................. 324/760; 324/754
[58] Field of Search ................................ 324/754, 760, 324/757, 758

[56] References Cited

U.S. PATENT DOCUMENTS 3,963,985  6/1976  Geldermans ................. 324/158 F
5,077,523  12/1991  Blanz .
5,124,639  6/1992  Carlin ........................... 324/158 P
5,198,753  3/1993  Hamburgen .

*Primary Examiner*—Ernest F. Karlsen
*Assistant Examiner*—Russell M. Kobert
*Attorney, Agent, or Firm*—Oblon, Spivak, McClelland, Maier & Neustadt

[57] ABSTRACT

A probe card assembly thermal influenced from a wafer with which a probe makes contact during a probe test. The assembly includes a probe card unit having a great number of probes to be brought into contact with the wafer to be tested, and a holder for holding the probe card unit at a center portion thereof. The holder includes a ring member, supported by another member, for supporting the probe card unit from a low side, and a cutout stepped member and a slot hole for relaxing stress due to thermal expansion concentrated on the ring member.

17 Claims, 14 Drawing Sheets

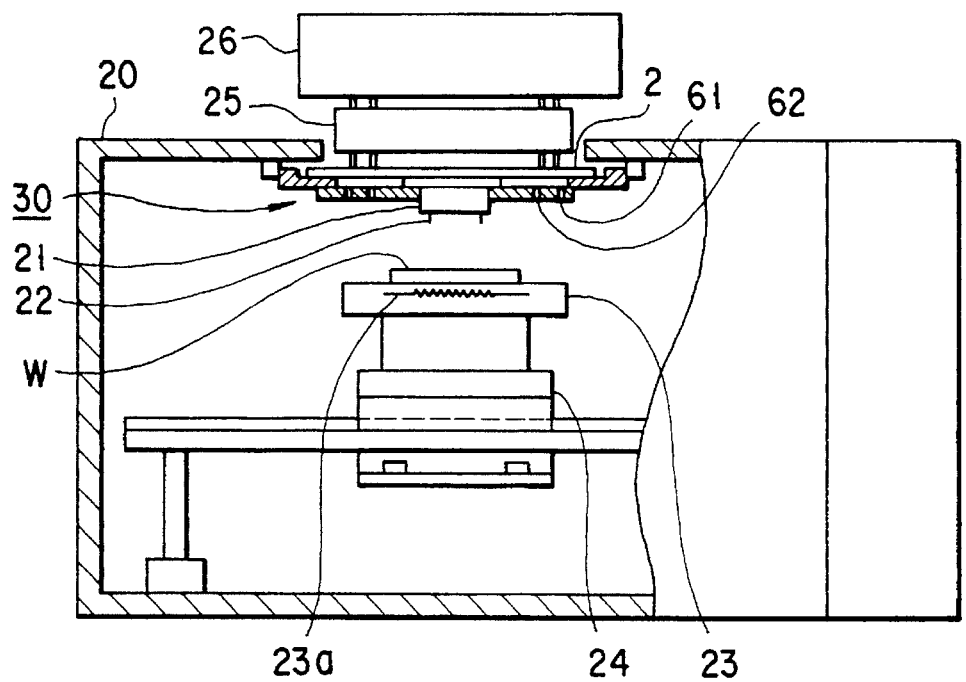
F I G. 1
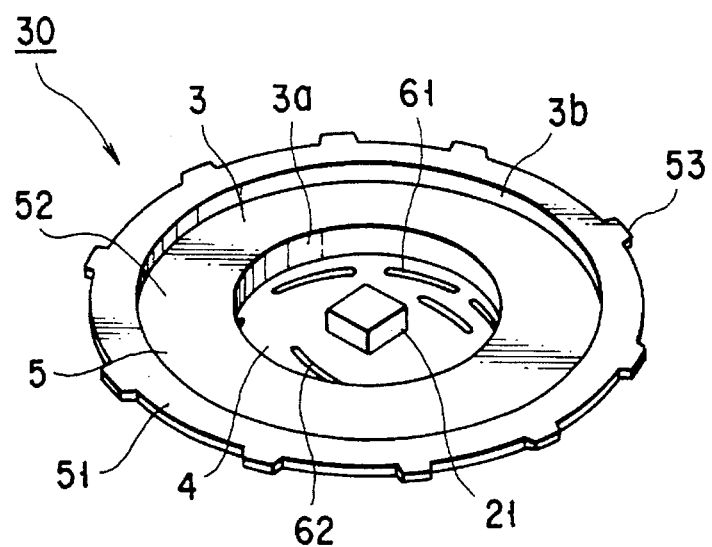
F I G. 4

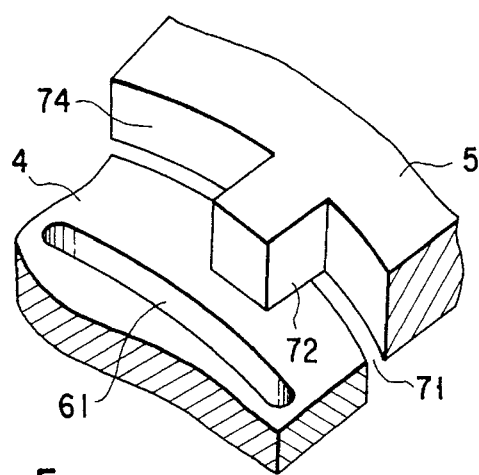
F I G. 5
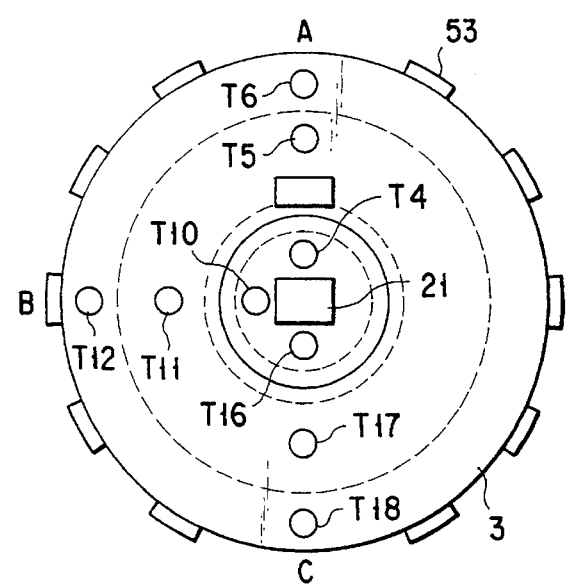
F I G. 7
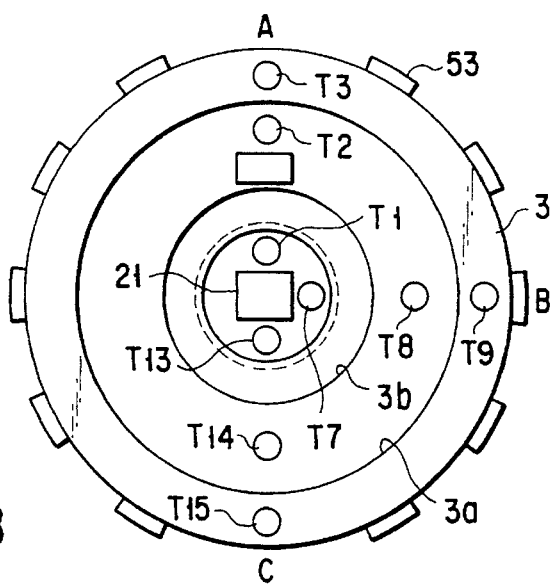
F I G. 8

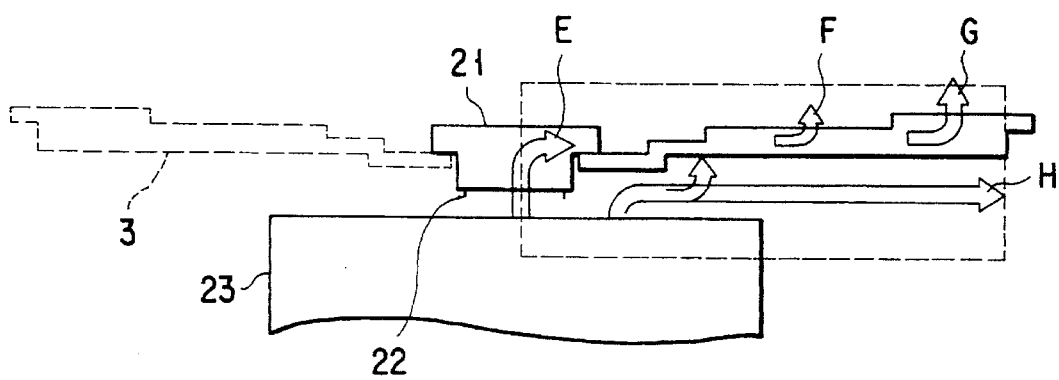
F I G. 11
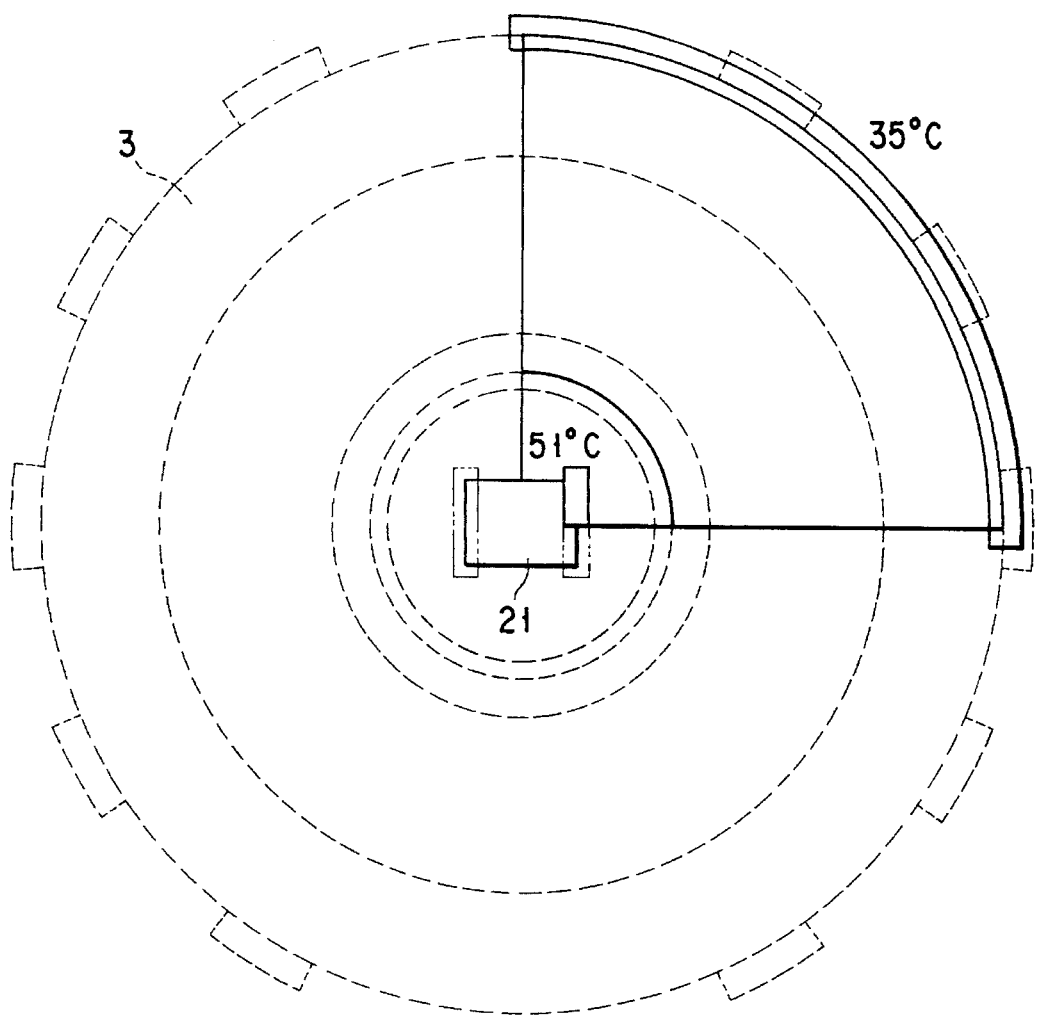
F I G. 12

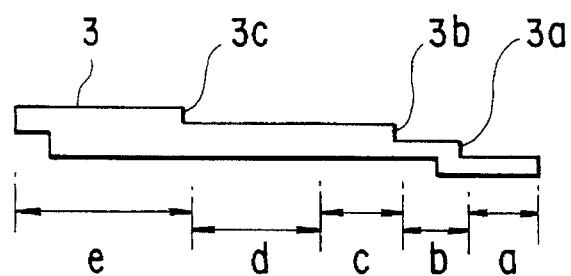
F I G. 13
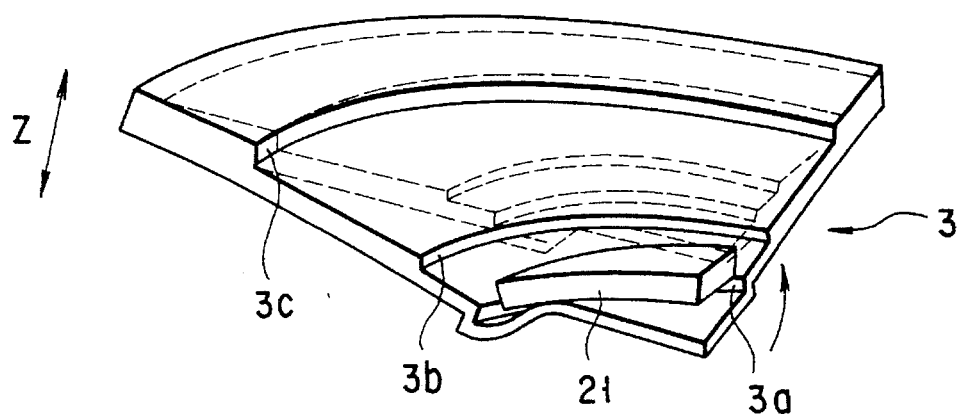
F I G. 14
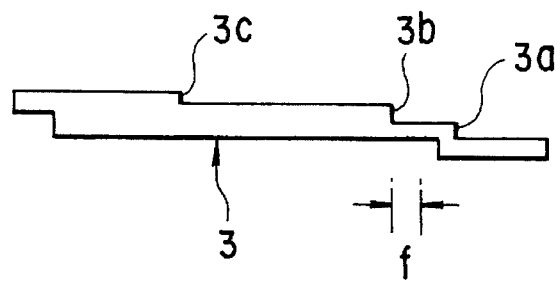
F I G. 15

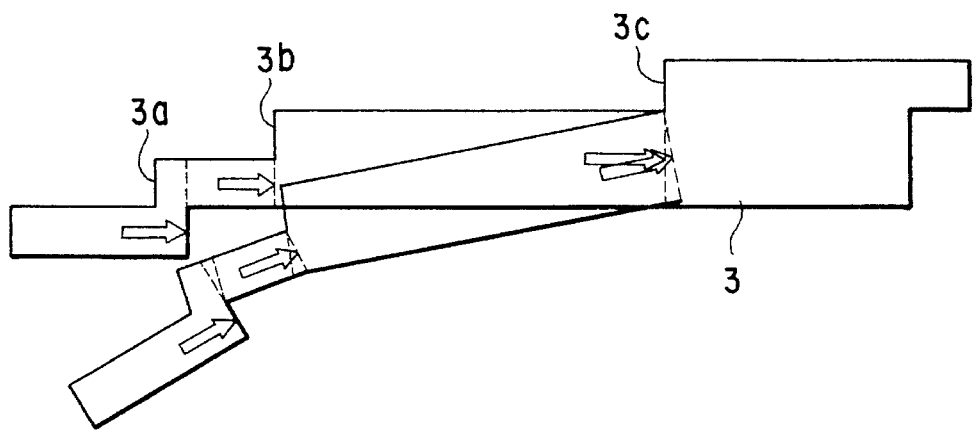
F I G. 16
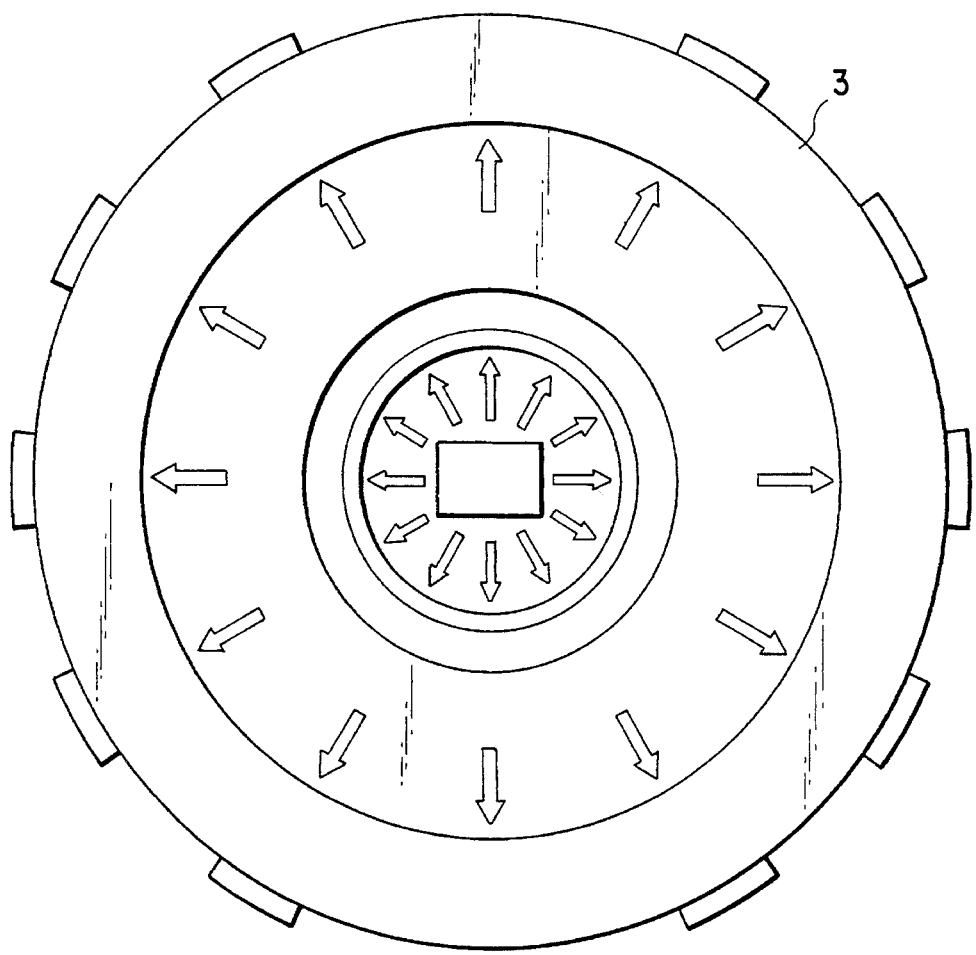
F I G. 17

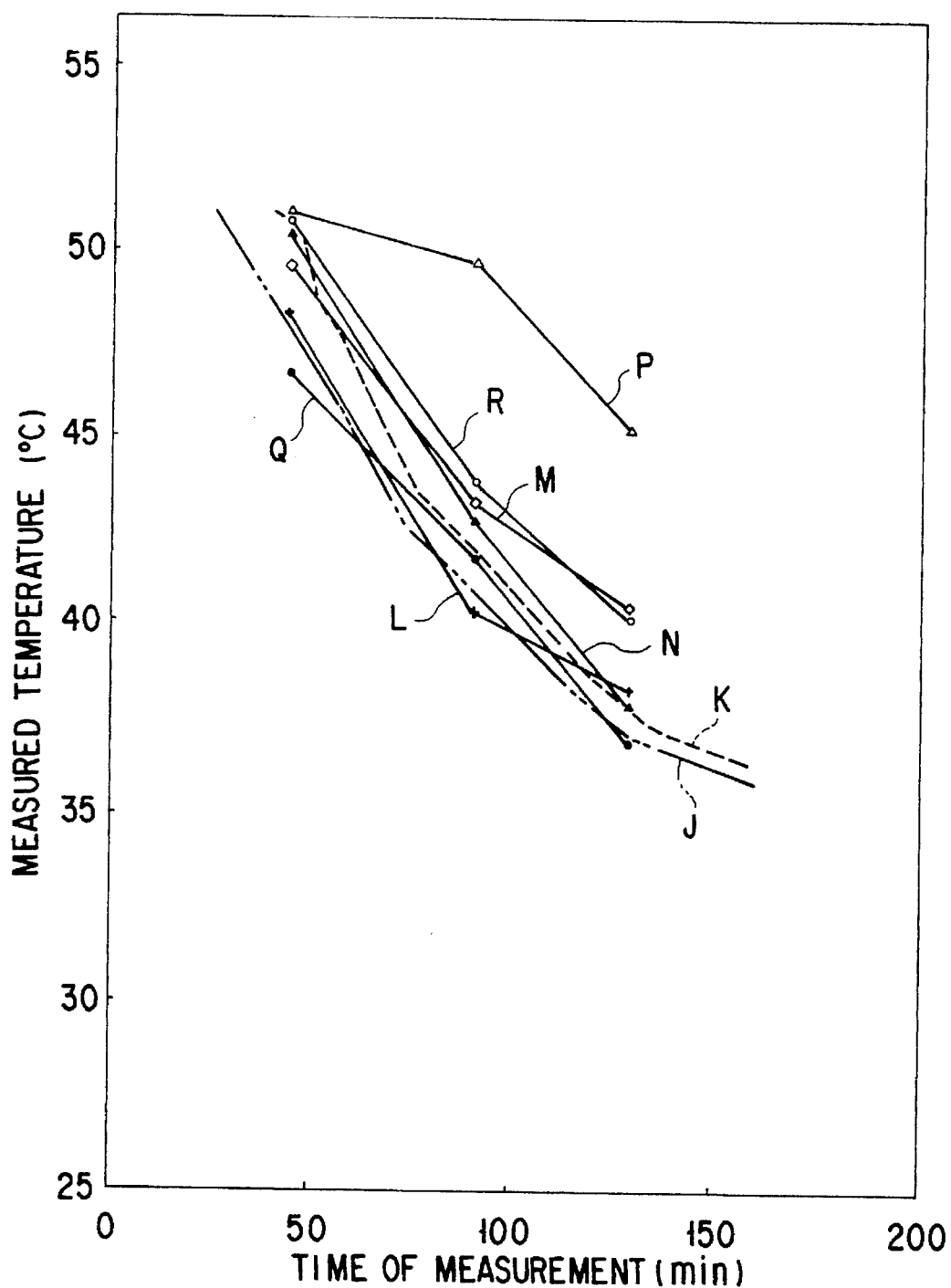
F I G. 18

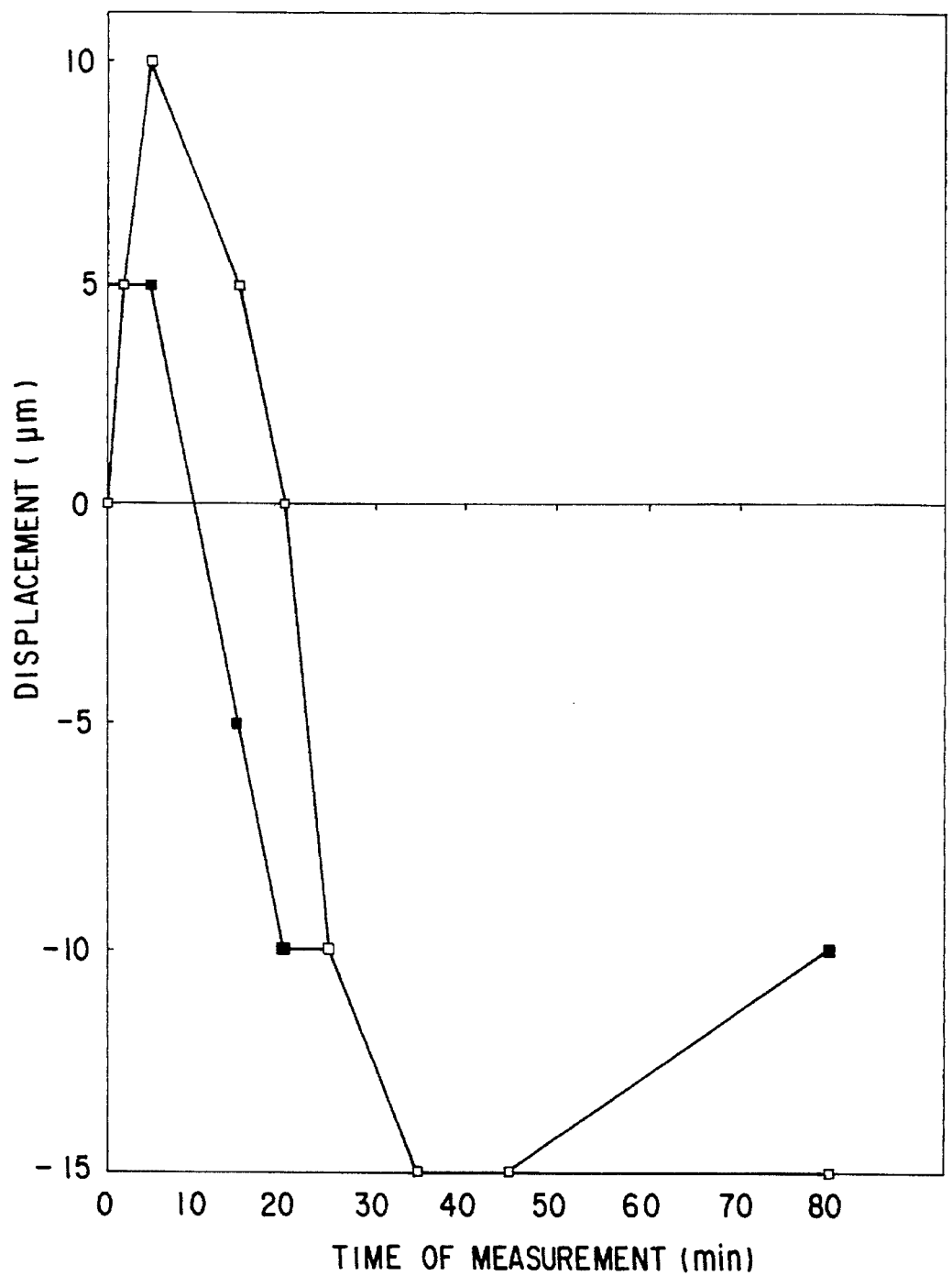
F I G. 2 1

PROBE CARD ASSEMBLY AND METHOD OF MANUFACTURING PROBE CARD ASSEMBLY

BACKGROUND OF THE INVENTION

1. Field of the Invention

The present invention relates to a probe card assembly used in a probe test for a semiconductor device, and a method of manufacturing such an assembly.

2. Description of the Related Art

In the probe test for semiconductor chips, a probe is brought into contact with a wafer placed on the stage, and a test signal is sent from the tester to the chip circuit via the probe. A probe card unit comprises a great number of probes, and the unit is to be held in a card holder. The probe card unit is electrically connected to a test head via a contact ring. The card holder is formed to have a coaxial 3-stepped portion.

In the case where a wafer W is electrically measured by means of such a probe card unit, the stage is stopped at such a position that the distance between the surface of the wafer and the tip of each probe is, for example, about 100 µm, and then ascended so as to bring the probes into contact with pads of a number of chips on the wafer all at once. Then, the wafer is further ascended by 80 µm for overdrive so as to assure the electrical contact between each probe and pad.

Recently, in many cases, the probe test is carried out under the condition of high temperature, before the wafer is diced into chips. More specifically, the wafer is heated to, for example, about 60° C.–150° C. by means of a heater built in the stage, and then the wafer is tested.

When the test is performed under such a high temperature condition, the card unit and the card holder are expanded by heat, and therefore the tip level of each probe (the height position of the tip of each probe) becomes lower than the level at room temperature. If each probe is brought into contact with each electrode pad, before the temperature of each of the card unit and the card holder is stabilized with respect to the temperature of the heated wafer, or the tip level of each probe is stabilized, the tip of the probe is pressed against the surface of the wafer by a large force by the expansion of the probe card due to heat propagated from the wafer after contact.

Recently, the number of pads has been increased greatly in accordance with an increase in the degree of integration of IC chip, and the number of IC chips brought into contact collectively with probes is likely to increase. The number of probes, in some cases, reaches as many as, for example, 1500. If a probe is pressed against a pad with a force larger than a predetermined load, the load applied on the stage from all the probes becomes so large that bearings of the mechanism for actuating the stage are deformed, thereby inclining the stage. As a result, some of the probes are disconnected from the respective pads, creating contact errors, and an accurate measurement cannot be conducted. Further, some probes can be damaged by deformation, and some IC chips may be damaged due to excess overdrive.

SUMMARY OF THE INVENTION

The object of the present invention is to provide a probe card assembly which is able to reduce the displacement of the tip of a probe due to heat, when a sample to be examined is subjected to a probe test in a heated or cooled condition, and a method of manufacturing such a probe card assembly.

According to an aspect of the present invention, there is provided a probe card assembly thermally influenced from a substrate with which a probe makes contact during a probing test, comprising:

a probe card unit having a plural number of probes to be brought into contact with the substrate for testing; and holder means for holding the probe card unit at a center portion thereof;

wherein the holder means further comprising decreasing means for decreasing a degree of a stress concentration caused by a differential thermal expansion of the holder means while being contact with the substrate.

According to another aspect of the present invention, there is provided a method of manufacturing a probe card assembly thermally influenced from a substrate with which a probe makes contact during a probing test, comprising the steps of:

heating or cooling a probe card unit having a plural number of probes;

measuring a thermal displacement of the probe card unit caused by the heating or cooling; and changing a structure of the probe card unit and/or a combination of materials used in the structure so that the thermal displacement can be decreased.

In the present invention, a wafer is placed on a stage and heated or cooled to a predetermined temperature, and probes are brought into contact with the wafer, thereby performing the probing test. The probe card is heated or cooled, and a thermal deformation (expansion or contraction) occurs. As a result, stress is concentrated on the stepped portion of the probe card unit, and the portion mounted to the frame of the main body, thereby creating a thermal displacement to the probe card unit. Thus, the contact means is moved upward or downward (or to the right-, or left-hand side when the probe card is vertically placed).

With the above-described structure, a probe card is manufactured with such remodeling that the thermal displacement of the probe card is within a predetermined allowable range, and therefore probes can be brought into contact with a wafer at a predetermined load.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagram showing a cross section of a main structure of an entire probe apparatus;

FIG. 4 is a diagram showing a plan view of a probe card assembly of the embodiment viewed from bottom;

FIG. 5 is a diagram showing a perspective view of a part of a probe card holder;

FIG. 7 is a diagram showing a plan view of a probe card assembly viewed from bottom, for explaining the designing of the probe card assembly;

FIG. 8 is a diagram showing a plan view of a probe card assembly viewed from top, for explaining the designing of the probe card assembly;

FIG. 11 is a diagram showing a model of thermal transfer from the wafer stage to the probe card assembly, for explaining the designing of the probe card assembly;

FIG. 12 is a diagram showing a partly plan view of the probe card assembly, for explaining the designing of the probe card assembly;

FIG. 13 is a diagram showing a profile of the probe card holder, for explaining the designing of the probe card assembly;

FIG. 14 is a diagram showing a partly perspective view of the probe card assembly, for explaining the thermal deformation of the probe card assembly;

FIG. 15 is a diagram showing a profile of the probe card holder, for explaining the sections of the probe card holder, to each of which stress is concentrated;

FIG. 16 is a diagram showing an explanatory model of thermal deformation of the probe card assembly;

FIG. 17 is a diagram showing an explanatory plan model view of thermal expansion of the probe card assembly;

FIG. 18 is a characteristic view showing values obtained from the actual measurement and calculated theoretical values for the purpose of comparison, as regards the temperature distribution of the probe card assembly of the embodiment;

FIG. 21 is a characteristic diagram showing thermal displacement of the probe card assembly of the embodiment;

DETAILED DESCRIPTION OF THE PREFERRED EMBODIMENTS

Figure 2:
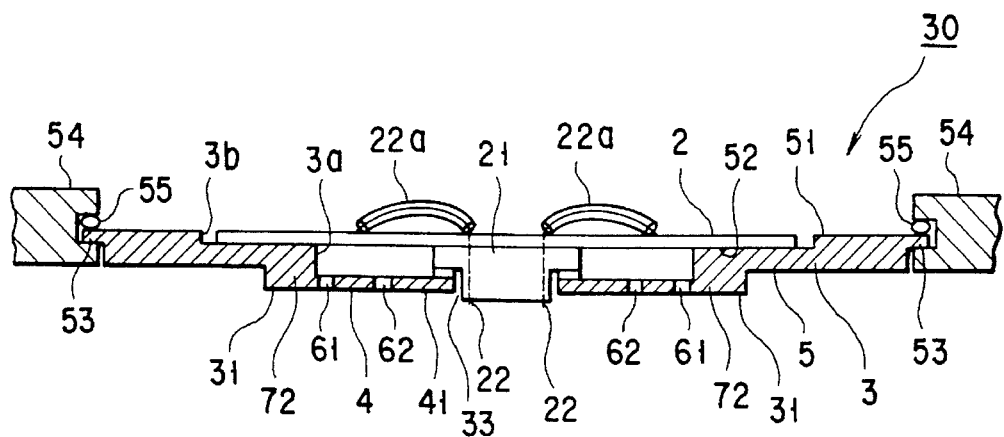
FIG. 2 is a diagram showing a cross section of a probe card assembly according to an embodiment of the present invention.

Embodiments of the probe card assembly according to the present invention will now be described with reference to accompanying drawings.

As shown in FIG. 1, a probe card assembly 30 is fixed on the upper part of a housing 20 of a probe apparatus. Directly below the probe card assembly 30, there is provided a stage 23, on which a semiconductor wafer W is subjected to the probing test. The stage 23 can be moved in the X-axis, Y-axis, Z-axis, and/or θ-rotation directions by means of a driving mechanism 24, and includes a heater 23a, by which the wafer W can be heated. In place of the heater 23a, a cooling device (not shown) may be provided for the stage so as to cool the wafer W. Directly above the probe card assembly 30, there is provided a contact ring 25, and a probe card 30 and a test head 26 are electrically connected to each other by means of pogo pins (not shown) of the contact ring 25. The probe apparatus having such a structure is disclosed in U.S. patent application Ser. No. 07/978,389, now abandoned.

The probe card assembly will be described with reference to FIGS. 2–4.

The probe card assembly 30 includes a printed circuit board 2, a holder 3, and a probe unit 21. The holder 3 is a ring-like member made of metal such as stainless steel. The printed circuit board 2 is supported by the holder 3. The probe unit 21 is set on the lower side of the printed circuit board 2. FIG. 3 shows the probe card assembly 30 viewed from bottom, and circular dots and black dots illustrated in this figure represents temperature measurement points, which will be described later. In FIG. 4, the illustration of the printed circuit board 2 is omitted.

The circuit of the board 2 is connected to a test head (not shown) via pogo pins (not shown), and the test head is further connected to a tester. A test signal (test start signal or test end signal) is sent to the chip circuit from the tester (not shown) via the test head and the probe card assembly 30.

The holder 3 includes the first and second ring members 4 and 5. The first and second ring members 4 and 5 are arranged such that the inner periphery of the second ring member 5 partially overlaps with the outer periphery of the first ring member 4 in the plan figure. The first ring member 4 is located below the second ring member 5. At the outer periphery of the second ring member 5, there are provided ten small flanges 53. The holder 3 is set to a ceiling plate 54 of the housing 20. An elastic member 55 is inserted between the ceiling plate 54 and each of the small flanges 53. The elastic member 55 is, for example, a rubber-made ring.

As can be seen in FIG. 5, the first and second ring members 4 and 5 are connected to each other by means of six joints 72, and the six joints are arranged on the inner periphery of the second ring member 5 at the same interval between adjacent ones. A cutout is made between any pair of joints 72 adjacent to each other, and there is provided a gap 71 between the first and second ring members 4 and 5. In the plan view shown in FIG. 3, the width of a gap is about 1 mm.

Figure 3:
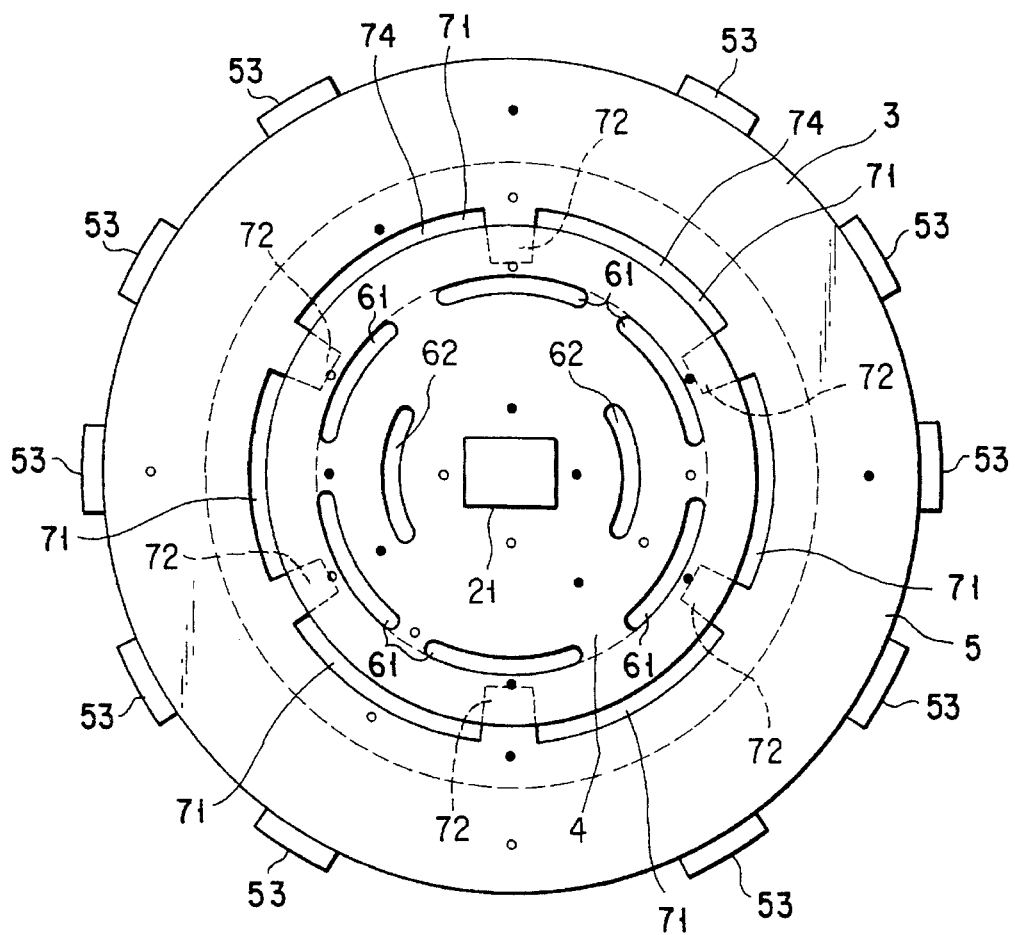
FIG. 3 is a diagram showing a plan view of a probe card assembly of the embodiment when viewed from top.
Figure 6:
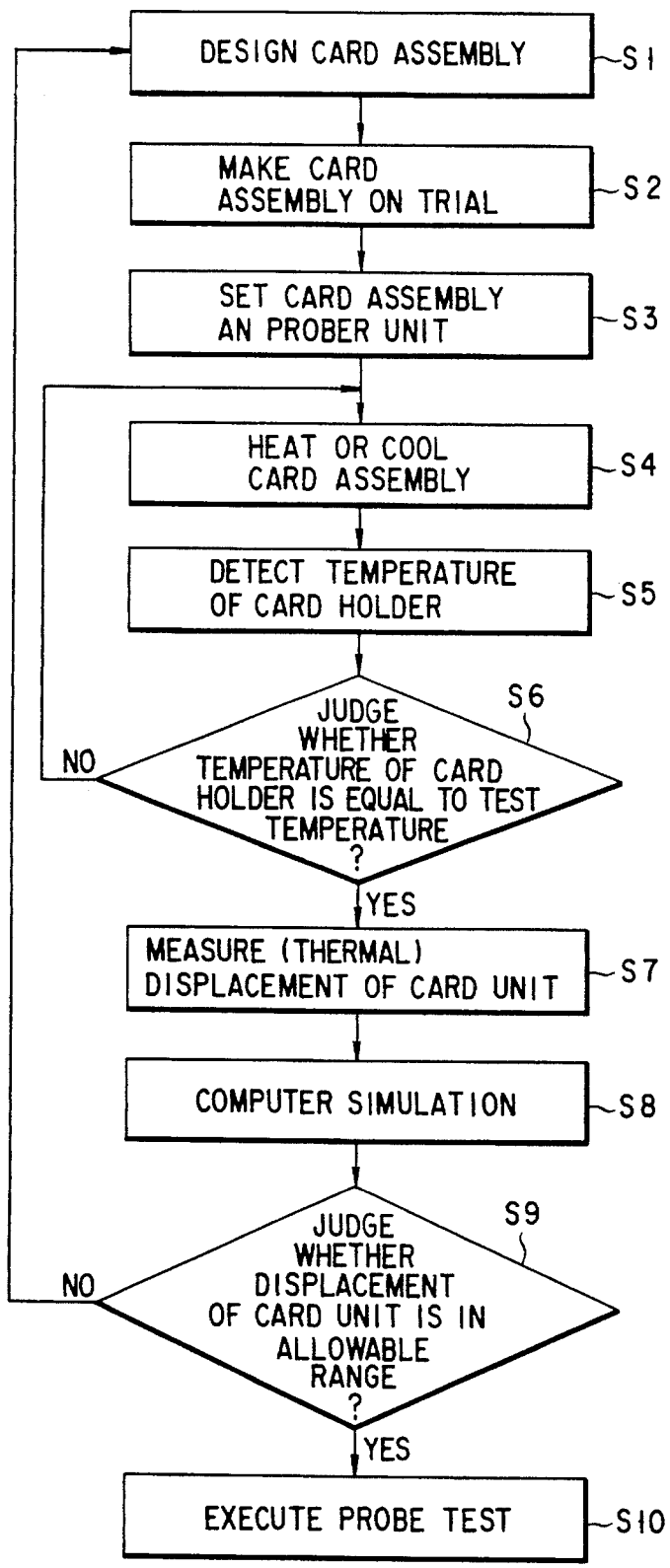
FIG. 6 is a flowchart of a method of manufacturing a probe card assembly according to the embodiment of the present invention.

As can be seen in FIG. 2, on the edge portion of the inner periphery of the second ring member 5, there is formed the first step section 3a. On the edge portion of the outer periphery of the second ring member 5, there is formed the second step section 3b. The first and second step sections 3a and 3b are coaxially formed. The first upper surface 51 of the holder 51 is located outer side of the second step section 3b, and serves as a reference surface for setting the probe unit 21 to the ceiling plate 54 of the probe apparatus. The printed circuit board 2 is supported on the second upper surface 52.

The probe unit 21 is provided such as to be in contact with the lower surface of the printed circuit board 2. The unit 21 is inserted into a center opening 33 of the holder 3, and fixed onto the surface of the inner periphery of the first ring member 4 via a spacer 41. The spacer 41 is made of a stainless steel member having a thickness of about 1 mm. In the unit 21, several hundred to several thousand probes 22 are vertically fixed. The diameter of each probes 22 is about 70 μm. The proximal end of each probe 22 is electrically connected to the electrode of the surface of the printed circuit board 2. Each probe 22 has a structure in which a core wire made of vanadium (v), a Pd—Ag alloy, a Be—Cu alloy, or a Au—Cu alloy is covered by a brass tube 22a, which is further coated with polyparaxylene as an electrical insulation layer.

Six elongated holes 61 are formed near the inner side (in the radial direction) of the first step section 3a, and are located on the inner side of the joint 72. Two second elongated holes 62 are formed on the inner side of the first elongated holes 61, and are located on the right and left sides of the probe unit 21. The first and second elongated holes 61 and 62 are arranged coaxially such as to make arcs.

A probe test of chips on an 8-inch-φ wafer W by use of the probe apparatus will now be described.

First, a wafer W is placed on the stage 23, and is heated by the heater 23a up to about 100° C. while aligning the wafer W and the probes 22. The stage 23 is ascended so that the probes 22 are brought into contact collectively with electrode pads of eight IC chips, and then further ascended by 80 μm for overdrive. After that, predetermined electrical characteristics of IC chips are tested by the test head 26. It takes about 3 minutes to complete a set of test, and the time required for moving the stage 23 for another tests of other IC chips is several hundred milliseconds.

During the test, the probe card assembly 30 is supposed to be deformed by heat propagated from the wafer W via the probes 22 by heat conduction or convection. However, the elongated holes 61 and 62 provided near the inner side of the first ring member 4 serve to relax the stress concentrated on the holder 3. Consequently, the thermal displacement of the probe card assembly, i.e., the lowered distance of the tip of each probe 22 (the amount of displacement in the Z-axis direction), will be small. Since an excessive load is not applied on the stage, the inclination of the stage 23 can be minimized, and a possible damage to the IC chip caused by the probes 22 can be avoided.

The designing and actual preparation of the probe card assembly 30 will now be described with reference to FIGS. 6–17.

First, a probe card assembly which is a remodeled conventional product is designed by use of CAD (step S1). The basic concept of the designing is relaxation of thermal stress. A designed remodeled probe card assembly is actually prepared (step S2), and set to the main body of the probe apparatus (step S3).

The probe card assembly 30 is placed such as to face the wafer stage 23, and the probes 22 are brought into contact with a metal-made dummy wafer (not shown), thereby heating the probe card assembly 30 indirectly by means of the heater 23a (step S4). Or, the probe card assembly 30 is cooled. The temperature of each of the given points on the holder 3 is detected by use of thermo couples (step S5).

As can be seen in FIGS. 7 and 8, the temperature was detected at the total of 9 points, i.e. 3 points in the upper surface side of each of portions A, B, and C of the holder 3, and similarly, at the total of 9 points, i.e. 3 points in each of these directions on the lower surface side. Apart from the above, the temperature inside the probe apparatus, the temperature of the upper section of the probe card assembly, and the temperature of the room were measured. In this figure, reference numerals provided besides white dots T1, T2, T3, T4, T5, T6, T7, T8, T9, T10, T11, T12, T13, T14, T15, T16, T17, and T18 each represent a point where the temperature is measured by a thermal couple.

Figure 9:
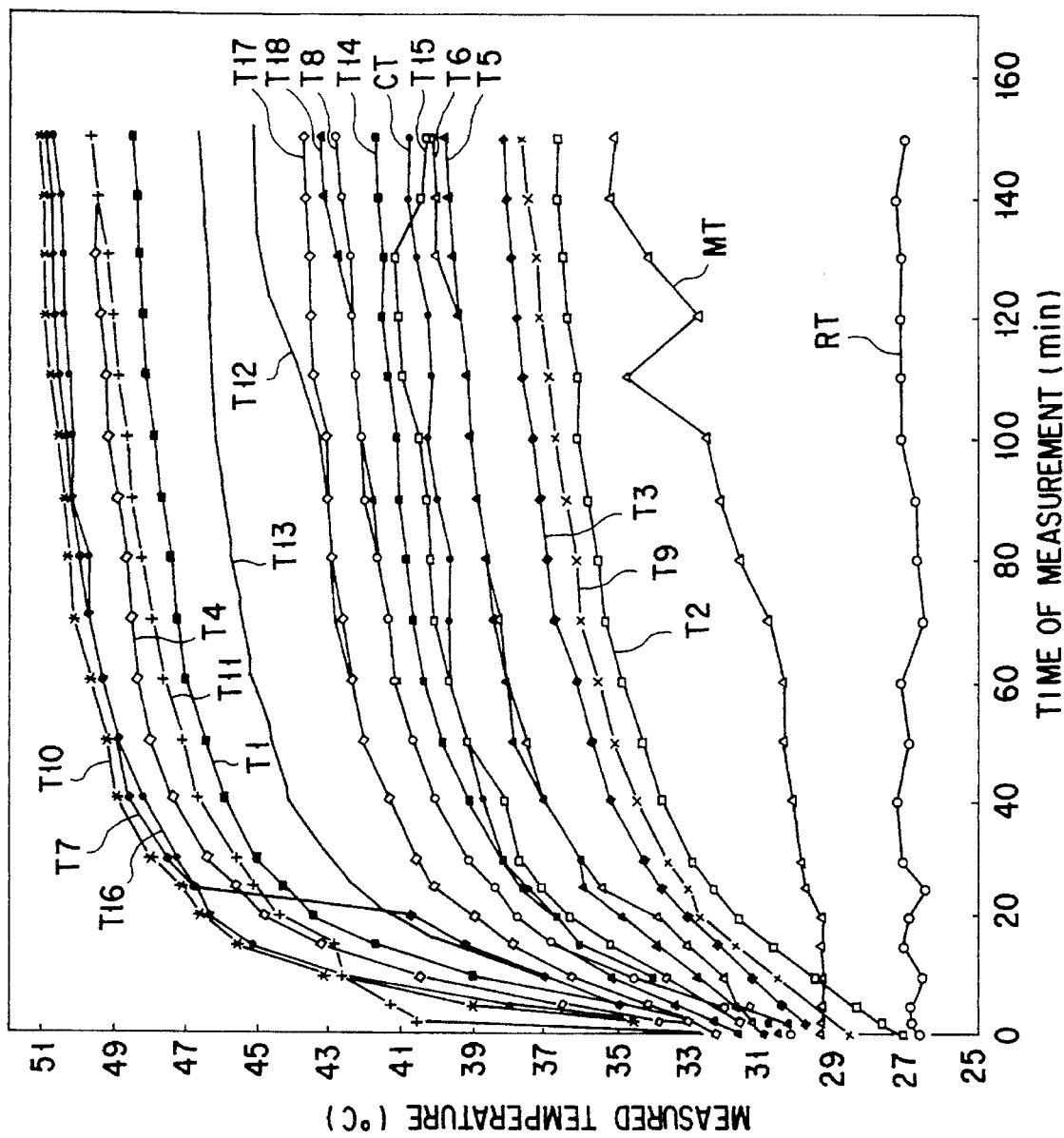
FIG. 9 is a characteristic diagram showing the temperature change in each of several sections of a probe card assembly, for explaining the designing of the probe card assembly.

FIG. 9 is a graph showing the temperature change at each of the measurement points, with the horizontal axis representing the time of measurement, and the vertical axis representing the measured temperature. The total time for the measurement was 150 minutes. As can be seen in FIG. 9, at each point, the temperature increases remarkably in about the first 20 minutes from the start of the measurement, and is stabilized from 60 minutes while continuing to increase gradually until 150 minutes. The room temperature was stable at about 27° C. throughout the measurement. In the graph, reference symbols MT and CT represent the history of the detected temperature in the probe apparatus, and that of the upper portion of the probe card assembly, respectively. In the measurement, the outer diameter of the card holder 3 was 320 mm, and that of the probe card unit 22 was 250 mm. The holder 3 is made of stainless steel (JIS standard SUS303), and the card unit 21 is made of Brass (BsBm).

At the point where the temperature of the holder 3 becomes equal to the probe test temperature (step S6), the thermal displacement of the card unit 21 in the Z direction is measured (step S7). The data of the measured amount of the thermal displacement is input to the computer operation system, and the displacement of each probe 22 is simulated by use of a CAD (step S8). In consideration of the result of the simulation, it is judged whether or not the displacement of the card unit 21 is allowable (step S9). If allowable, the probe card assembly can be used for the test, and therefore the probe test is executed (step S10). If not allowable, the operation routine returns to the first step S1, and the probe card assembly is redesigned. Thus, a new probe card assembly is prepared, and the same procedure is repeated. If still not allowable, the same trial-and-error operation is repeated.

The measurement of thermal displacement of sections of the probe card assembly will be described.

The thermal displacement of each section was measured at the same timing as the temperature measurements. In the measurement method, the stage 23 was heated up to 87° C., and ascended so as to bring the dummy wafer into contact with the tip of each probe 22. The contact between the dummy wafer and the tip of each probe 22 was confirmed by detecting a contact current. Further, the position of the contact was recorded, and after the heating was started, the stage 23 is moved up and down at an interval of four minutes so as to record the position of that probe 22 at the times.

Figure 10:
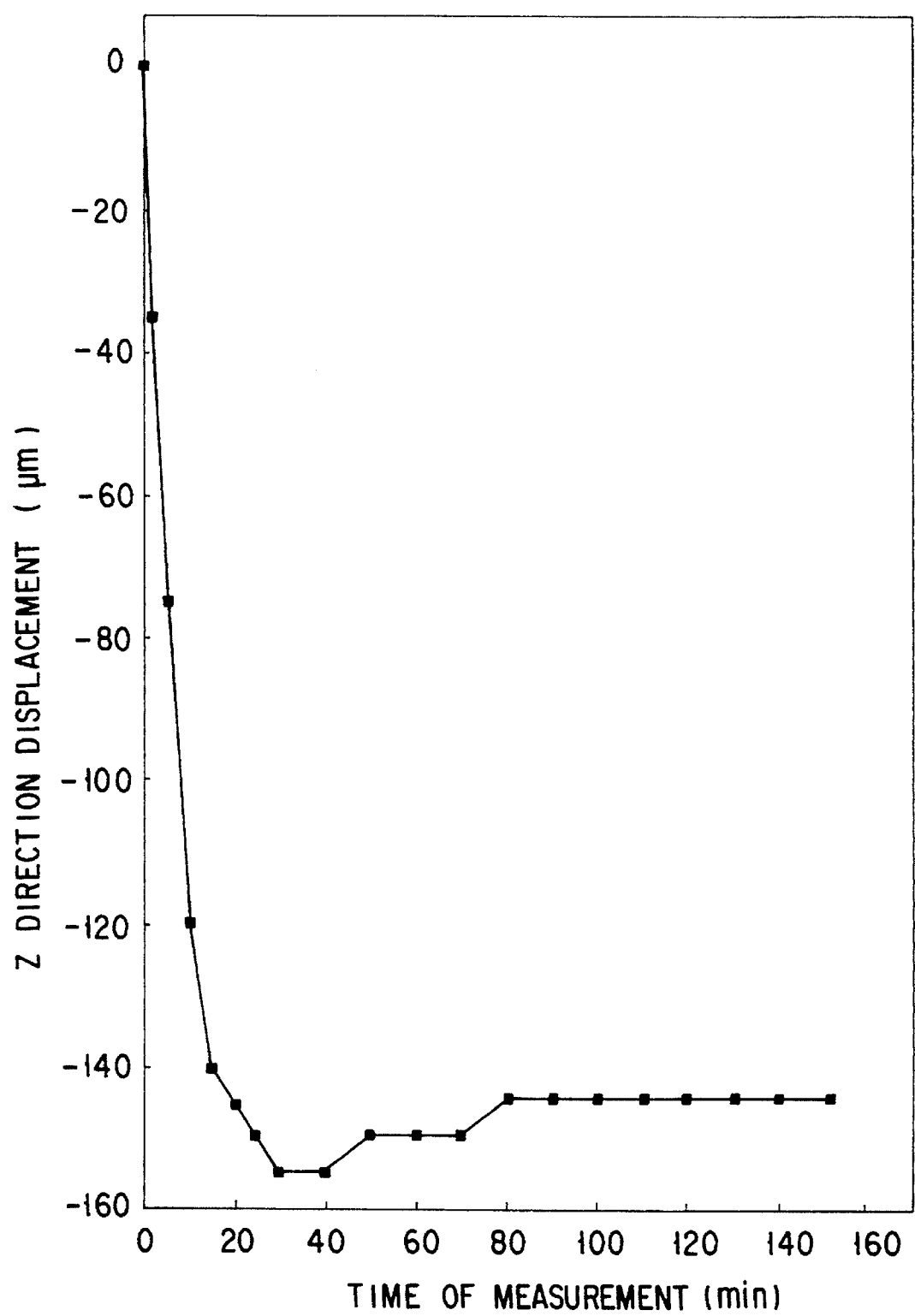
FIG. 10 is a characteristic diagram showing the amount of displacement of a probe card assembly, for explaining the designing of the probe card assembly.

FIG. 10 is a graph showing the change in the position of the tip of the probe 22 along with time, with the horizontal axis representing the time of measurement, and the vertical axis representing the displacement of the tip position of the probe in the Z direction. As can be seen in this figure, the tip of the probe 22 is lowered remarkably in about the first 20 minutes from the start of the measurement, and the displacement is maximized to 155 μm 30 minutes after the start. After that, the tip of the probe 22 rises slightly, and from 80 minutes on, the displacement does not change, but stays at constant to 145 μm. The mobile accuracy error of the stage 23 in the Z direction is within about ±5 μm.

The transfer of heat from the stage 23 to sections of the probe card assembly will be described with reference to FIGS. 11 and 12.

The main heat flows are heat conduction flow E directly propagated from the stage 23 to the probe card unit 21 and heat convection H of the air warmed by the stage 23. It is considered that part of the heat flowed in is radiated (heat flow F) out to the atmosphere, and the rest is propagated to the ceiling plate 54 (heat flow G). Let us now consider a simplified heat flow model of only heat conduction, in which all the heat is propagated from the stage 23 through the probe card unit 21 to the ceiling plate 54. Thus, the boundary temperature is the only boundary condition for heat.

As regards the above, the temperature was calculated as for the model shape, which one quarter of the holder 3, shown in FIG. 12. More specifically, the shape deformed by heat was simulated by a computer, with the actually measured temperature of the holder 3 taken as the boundary temperature. The boundary temperature for the section brought into contact with the probe card unit 21 was set to 51° C., and that for the outer periphery was set to 35° C. The boundary temperature for each section can be determined from the actually measured temperatures shown in FIG. 9. For the operation of the computer simulation, the physical constants shown in Table 1 below were used.

TABLE 1

|  | Stainless steel (SUS303) | Brass (BsBm) |
| --- | --- | --- |
| Heat conductivity (J/(msec °C.)) | 15.49 | 83.7 |
| Young's modulus (kg/mm$^2$) | 20800 | 9600 |
| Posson's ratio | 0.32 | 0.35 |
| Coefficient of linear expansion (× 10$^{-6}$) | 14.8 | 18.7 |

The temperature obtained at each of the specified sections of the probe card assembly is shown in FIG. 13. The temperature distribution was 46°–51° C. in the center portion a of the holder, 43°–46° C. in the portion b, 39°–43° C. in the portion c, 37°–39° C. in the portion d, and 35°–37° C. in the periphery portion e of the holder. There was no substantial difference in temperature between the upper and lower surfaces of the holder.

As shown in FIG. 14, the holder and the card can be deformed (or displaced) by heat. In this figure, the broken line outlines the holder as of before deformation, and the full line outlines the deformed holder and card. The illustration is based on the theoretical thermal deformation (or displacement) caused by the temperature difference above, which is expected from calculation. As a result, the amount of deformation increases from the periphery of the holder towards the center portion, and the maximum deformation amount at the center portion a of the holder was as large as 126 μm.

According to the examination of the stress distribution, a large stress is applied to the inner region f of the second step portion 3b, as shown in FIG. 15. Due to the stress, the card unit (probe card unit) 21 itself is warped up while putting the holder 3 upward. This is because the linear expansion coefficient of Brass (BsBm), of which the card unit 21 is made, is larger than that of stainless steel, of which the holder 3 is made. Due to the warp, the displacement in the Z-axis direction slightly decreases to 123.5 μm.

The reason why such thermal deformation occurs will be described with reference to FIGS. 16 and 17.

As indicated by arrows in FIGS. 16 and 17, the thermal expansion occurs from the center portion of the holder 3 towards the periphery in an isotropic manner. Thus, the holder is deformed discontinuously at each of sections 3a, 3b and 3c. More specifically, the higher step portion is pressed by the lower step portion towards the periphery, distorting the junction part therebetween. However, the section of the higher step portion which is not directly jointed to the lower step portion (that section of the higher step portion which is not pressed) is not distorted. As a result, a downward moment acts on the upper (higher) portion of each of the step gap sections 3a, 3b, and 3c. Since the periphery of the holder 3 is fixed to a large unit, the center portion of the holder is displaced downward.

FIG. 18 is a graph showing a temperature distribution obtained by numeral calculation and an actually measured distribution for comparison. In this figure, a double-dot line J and a dot line K represent temperature distributions along the portions B and C, respectively, obtained from calculation. Each of the other curve lines represents a temperature distribution in the normal state 150 minutes after the start, as shown in FIGS. 7 and 8. The curve L represents the temperature distribution of the upper surface of portion A; the curve M for that of the lower surface of portion A, the curve N for that of the upper surface of portion B; the curve P for that of the lower surface of portion B; the curve Q for that of the upper surface of portion C; and the curve R for that of the lower surface of portion C. As is clear from the FIG. 18, the curves L to R showing the actually measured temperature distributions and the curves J and K showing the calculated temperature distributions substantially coincide with each other, except that there is a difference in measured value of temperature by 1°–2° C. between the corresponding upper and lower surfaces.

As can be understood from the above description, in the holder 3, the inner side has a high temperature, and the temperature decreases towards the outer side. As a result, the holder 3 expands by heat towards the outer side, and the stress is concentrated near the step portion 3b, thereby displacing the center portion of the holder downward.

In the present invention, the number of step portions of the holder 3 is reduced by 1 such that the holder has a three-step structure. Thus, the number of sections to which a stress is applied is reduced, thereby suppressing the displacement of the center portion of the holder in the Z direction. Further, the elongated holes 61 and 62 serve to absorb the thermal expansion in the form of elastic deformation. Consequently, the inclination of the side surface of the step portion 3a can be suppressed, thereby decreasing the downward displacement (in Z direction) of each probe 22.

Figure 19:
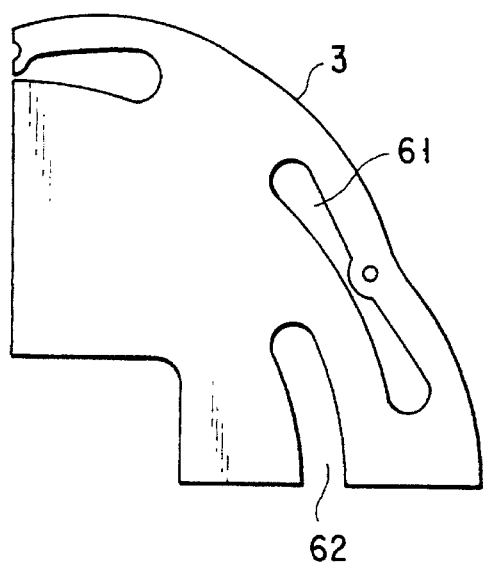
FIG. 19 is a plan view of a thermally deformed section of the probe card assembly of the present invention.
Figure 20:
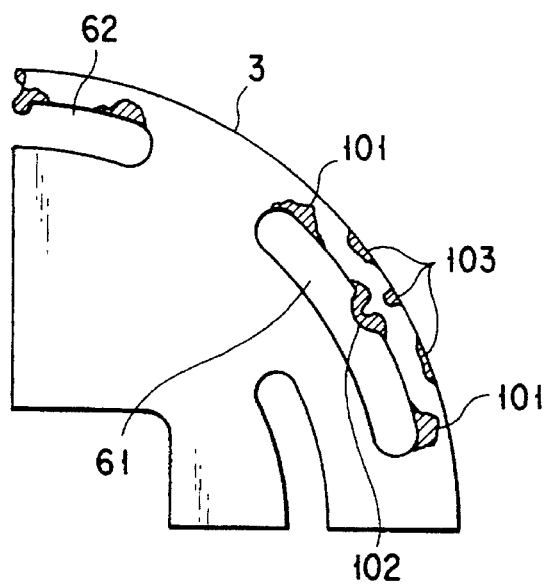
FIG. 20 is a diagram showing a visualized stress distribution of the probe card assembly of the embodiment.

FIG. 19 shows an illustration of the thermally deformed holder of the probe card assembly according to the above embodiment. FIG. 20 is a diagram showing the distribution of the stress applied on the holder, which is calculated from the computer. FIG. 19 shows an enlarged view of a part of the holder with a deformation rate of about 200 times as much as usual. The stress forces applied on the shaded regions 101, 102 and 103 were −2.12 to −0.06, 0.06 to 2.68, −2.12 to −0.06, respectively, and the stress on the other region was −0.06 to 0.06. As is clear from the figure, the elastic deformation occurs in the regions of the elongated holes 61 and 62, thereby relaxing the regional stress near the step portion 3a.

The probe card holder 3 had a thickness of 4–5 mm, and an outer diameter of 320 mm. The inner diameter of the step portion 3a between the ring members 4 and 5 was 186 mm.

The width of each of the elongated holes 61 and 62 was 10 mm. The gap 71 which could be observed from below as a plan view was about 1 mm.

With use of a probe card having the structure of the present invention, the Z-direction displacement of the probes 22 was measured in the same manner as for the conventional probe card assembly, and the results were as shown in the graph of FIG. 21. As is clear from the figure, the maximum displacement observed in the case where the stainless steel-made holder 3 was employed, was 15 μm. with the conventional probe card assembly, the maximum displacement was 155 μm (see FIG. 10). Further, the maximum displacement when the aluminum-made holder 3 was used, was ±5 μm. Moreover, the three-step structure is preferable for the holder 3, as can be understood from the test results of the embodiments. It should be noted that the maximum displacement of the holder 3 having the three-step structure only, and without making the elongated holes 61 and 62, was about 80 μm, which is only a half of the conventional case. Therefore, the elongated holes 61 and 62 are essential in order to achieve a sufficient advantage.

The shape of a hole made in the holder for the purpose of the relaxation of regional stress is not limited to an elongated circle (slot hole), but may be circular or quadrilateral. Further, a number of holes, i.e. three or more, can be formed such that the holes are coaxially arranged.

Figure 22:
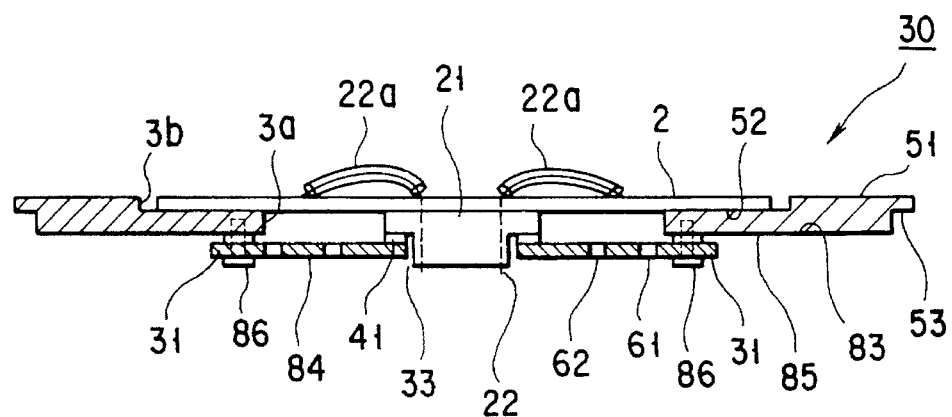
FIG. 22 is a diagram showing a cross section of a probe card assembly according to another embodiment.
Figure 23:
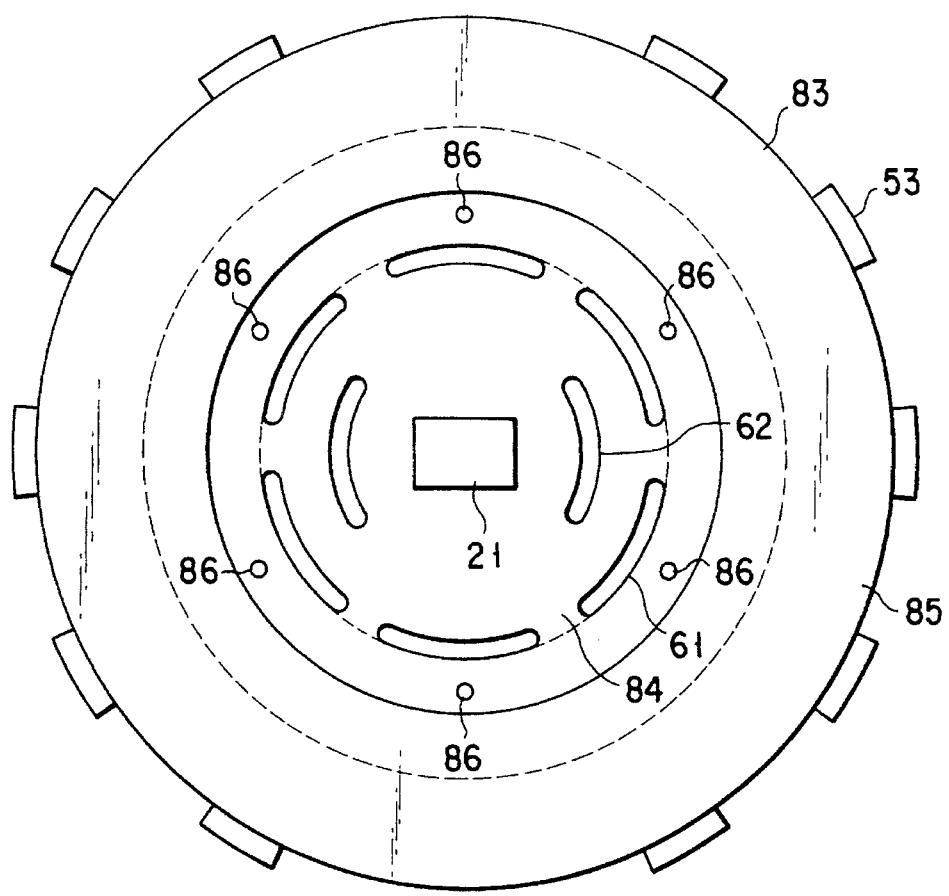
FIG. 23 is a diagram showing a plan view of a probe card assembly according to another embodiment when viewed from bottom.

As shown in FIGS. 22 and 23, two ring members 84 and 85 may be combined into a holder 32. In this case, the first ring member 84 is fixed to the second ring member 85 with six screws 86.

Figure 24:
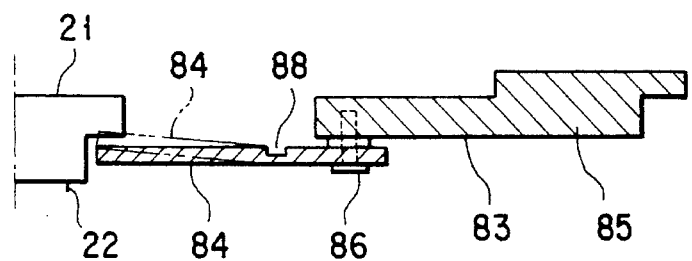
FIG. 24 is a diagram showing a cross section of a part of a probe card assembly according to another embodiment.
Figure 25:
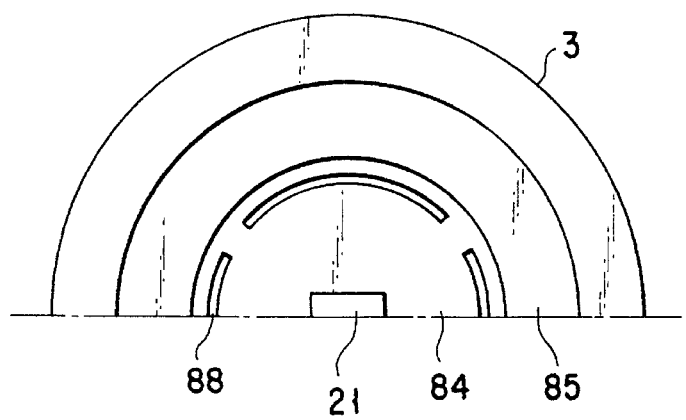
FIG. 25 is a diagram showing a plan view of a part of a probe card assembly according to another embodiment when viewed from top.

As shown in FIGS. 24 and 25, four grooves 88 may be formed in the ring member 84 located in the inner side. The four grooves 88 are provided such as to be arranged on the same circumference on the upper surface of the first ring member 84. When the entire holder 83 is thermally expanded, only the inner-side ring member 84 is warped upward due to the effect of the grooves 88, and therefore only the ring member 84 is displaced. Consequently, the probe unit 21 is pushed up by the ring member 84, canceling some of the downward displacement of the probes 22 in the Z direction due to thermal expansion. Therefore, the Z-direction displacement can be decreased. The grooves 88 may be formed such as to be continuous all along the circumference, or separately three or more in a coaxial fashion.

Figure 26:
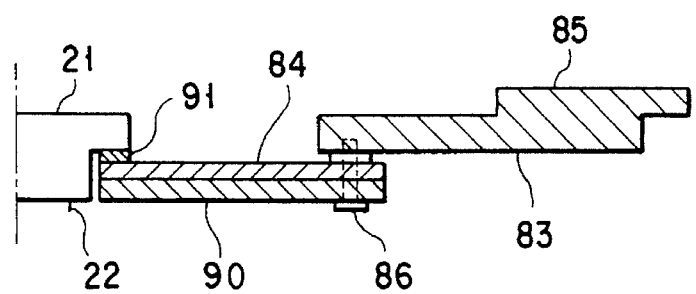
FIG. 26 is a diagram showing a cross section of a part of a probe card assembly according to another embodiment when viewed from bottom.

As shown in FIG. 26, a plate 90 is adhered on the lower surface of the first ring member 84 to form a bimetal. A plate made of copper (Cu) or brass having a coefficient of thermal expansion larger than that of stainless steel, is used as the plate 90. In this case, a contact member 91 should be set at the innermost section of the first ring member 84 such that the contact member 91 is brought into contact with the probe card unit 21. With this structure, the first ring member 84 warps upward along with the plate 90 due to the effect of bimetal, thereby decreasing the downward displacement of the probes 22 in the Z direction.

Figure 27:
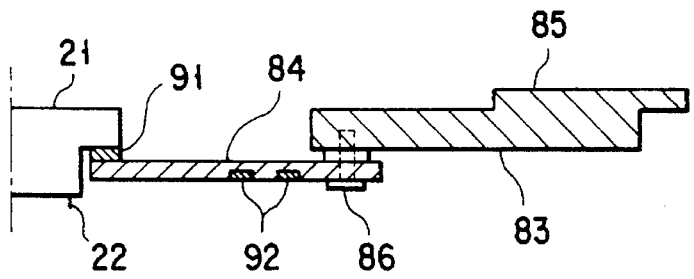
FIG. 27 is a diagram showing a cross section of a part of a probe card assembly according to another embodiment.

As shown in FIG. 27, a member 92 may be embedded under the first ring member 84. The member 92 should be made of an alloy of nickel (Ni), iron (Fe) and cobalt (Co).

The embodiments described above are directed to the cases where the probe card assembly was heated; however the present invention is not limited to these embodiment, but the assembly may be cooled. In the case of cooling, the probes are displaced upward due to thermal deformation (deformation due to cooling), and therefore the method of avoiding the thermal deformation becomes opposite to that of the above-described embodiments.

Lastly, the present invention is not limited to the assembly having a structure in which probes 22 project vertically from a card unit, as of the embodiments, but may be applied to a structure in which probes project diagonally from a card unit. The present invention can be applied, not only to semiconductor wafers, but to LCD substrates.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A probe card assembly thermally influenced from a substrate with which a probe makes contact during a probing test, comprising:

a probe card unit having a plural number of probes to be brought into contact with said substrate to be tested; and holder means for supporting said probe card unit at a center portion thereof;

wherein said holder means is a ring member having an innermost ring portion and an outer ring portion coaxially arranged, and a ring-like stepped portion for connecting the innermost ring portion and the outer ring portion on different levels, and has a ring-portion for supporting the probe card unit from a low side, and stress concentration relieving means, said stress concentration relieving means reducing a degree of a stress concentration caused by a differential thermal expansion of said holder means while said plural number of probes are in contact with said substrate, and maintaining a profile of said plural number of probes substantially unchanged even if a temperature of said probe card unit varies.

2. A probe card assembly according to claim 1, wherein said stress concentration relieving means includes a plurality of slot holes arranged along a plurality of coaxial circles on said innermost ring portion.

3. A probe card assembly according to claim 2, wherein said slot holes are arranged on two coaxial circles on said innermost ring portion.

4. A probe card assembly according to claim 1, wherein said innermost ring portion and said outer ring portion are integrally formed.

5. A probe card assembly according to claim 1, wherein said innermost ring portion is fixed onto said other ring portion by a screw.

6. A probe card assembly according to claim 1, wherein said stress concentration relieving means includes a bimetal member adhered to one side of said innermost ring portion, which has a coefficient of thermal expansion different from that of said innermost ring portion, so as to cancel a total thermal expansion of said ring portions.

7. A probe card assembly according to claim 1, wherein said stress concentration relieving means includes a bimetal member embedded into one side of said innermost ring portion, which has a coefficient of thermal expansion different from that of said innermost ring portion.

8. A probe card assembly, comprising:

a probe card unit including a plurality of probes for contacting and testing; and a support for said probe card including:

an inner ring supporting said probe card unit, said inner ring having an outside diameter;

an outer ring connected to the inner ring, the outer ring having an inside diameter which is greater than the outside diameter of the inner ring; and a plurality of projecting members which face a center of the inner ring and which are connected to and overlap the inner ring and are connected to the outer ring, wherein said inner ring comprises holes therethrough at radially inward positions from the protecting members, said holes serving to absorb thermal expansion by elastic deformation.

9. A probe card assembly according to claim 8, wherein:

said thermal expansion is at least a thermal expansion of an inner portion of said outer ring.

10. A probe card assembly according to claim 8, wherein:

said holes are elongated in shape, arranged along a radius, and form arcs.

11. A probe card assembly according to claim 8, wherein:

said holes are arranged to form two sets of elongated holes, said sets being respectively arranged on circles having different radiuses.

12. A probe card assembly, comprising:

a probe card unit including a plurality of probes for contacting and testing;

a support for said probe card including:
an outer ring; and
an inner ring, connected to the outer ring, including holes therethrough at radially inward positions from where the inner ring is connected to the outer ring, said holes serving to absorb thermal expansion by elastic deformation.

13. A probe card assembly according to claim 12, wherein:

said thermal expansion is at least a thermal expansion of an inner portion of said outer ring.

14. A probe card assembly according to claim 12, wherein:

said holes are elongated in shape, arranged coaxially and form arcs.

15. A probe card assembly according to claim 12, wherein:

said holes are arranged to form two sets of elongated holes, said sets being respectively arranged on circles having different radiuses.

16. A probe apparatus for measuring electrical characteristics of an object to be tested by putting a plurality of probes in electrical contact with the object, said apparatus comprising:

an apparatus body;

probe card means having a plurality of probes; and a probe card holder for holding said probe card means at a measurement position facing said object within the apparatus body, wherein said probe card holder is provided with holes or grooves extending in the circumferential direction thereof such that a thermal stress applied to said probe card holder at the time of measurement is reduced.

17. A probe apparatus for measuring electrical characteristics of an object to be tested by putting a plurality of probes in electrical contact with the object, said apparatus comprising:

an apparatus body;

probe card means having a plurality of probes; and a probe card holder for holding said probe card means at a measurement position facing said object within the apparatus body, wherein said probe card holder comprises a combination of materials having different thermal expansion coefficients such that thermal deformation at the time of measurement is cancelled.

* * * * *